(12) United States Patent
Bae et al.

(10) Patent No.: US 10,923,195 B2
(45) Date of Patent: Feb. 16, 2021

(54) NONVOLATILE MEMORY DEVICE, AN OPERATING METHOD THEREOF, AND A STORAGE SYSTEM INCLUDING THE NONVOLATILE MEMORY DEVICE

(71) Applicant: SAMSUNG ELECTRONICS CO., LTD., Suwon-si (KR)

(72) Inventors: Minkyung Bae, Suwon-si (KR); Tae Hun Kim, Suwon-si (KR); Myunghun Woo, Suwon-si (KR); Bongyong Lee, Suwon-si (KR); Doohee Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/686,327

(22) Filed: Nov. 18, 2019

(65) Prior Publication Data
US 2020/0357471 A1 Nov. 12, 2020

(30) Foreign Application Priority Data
May 9, 2019 (KR) .................. 10-2019-0054546

(51) Int. Cl.
*G11C 11/34* (2006.01)
*G11C 16/14* (2006.01)
(Continued)

(52) U.S. Cl.
CPC .......... *G11C 16/14* (2013.01); *G11C 16/0483* (2013.01); *G11C 16/08* (2013.01); *H01L 27/11582* (2013.01)

(58) Field of Classification Search
CPC ..... G11C 16/16; G11C 16/14; G11C 16/3445; G11C 16/344; H01L 27/115
(Continued)

(56) References Cited

U.S. PATENT DOCUMENTS 8,547,747 B2   10/2013   Kim et al.
9,019,775 B2   4/2015    Costa et al.
(Continued)

OTHER PUBLICATIONS

Caillat et al., "3DNAND GIDL-Assisted Body Biasing for Erase Enabling CMOS Under Array (CUA) Architecture", IEEE International Memory Workshop (IMW), 2017, pp. 1-27.

*Primary Examiner* — Son T Dinh
(74) *Attorney, Agent, or Firm* — F. Chau & Associates, LLC

(57) ABSTRACT

An operating method of a nonvolatile memory device which includes a cell string including a plurality of cell transistors connected in series between a bit line and a common source line and stacked in a direction perpendicular to a substrate, the method including: programming an erase control transistor of the plurality of cell transistors; and after the erase control transistor is programmed, applying an erase voltage to the common source line or the bit line and applying an erase control voltage to an erase control line connected to the erase control transistor, wherein the erase control voltage is less than the erase voltage and greater than a ground voltage, and wherein the erase control transistor is between a ground selection transistor of the plurality of cell transistors and the common source line or between a string selection transistor of the plurality of cell transistors and the bit line.

20 Claims, 14 Drawing Sheets

(51) Int. Cl.
    *G11C 16/08*    (2006.01)
    *G11C 16/04*    (2006.01)
    *H01L 27/11582*    (2017.01)

(58) Field of Classification Search
    USPC .................................... 365/185.29, 185.18
    See application file for complete search history.

(56) References Cited

U.S. PATENT DOCUMENTS

| | | |
|---|---|---|
| 9,147,478 B2 | 9/2015 | Park |
| 9,349,482 B2 * | 5/2016 | Kim .................. G11C 16/3459 |
| 9,583,505 B2 | 2/2017 | Ishida et al. |
| 9,613,980 B2 | 4/2017 | Yamada et al. |
| 9,916,901 B1 | 3/2018 | Saito et al. |
| 10,042,755 B2 | 8/2018 | Sakui |
| 2007/0195609 A1 * | 8/2007 | Kim ...................... G11C 16/16 |
| | | 365/185.29 |

* cited by examiner

FIG. 9A

| [ERS] | Voltage |
|---|---|
| BL1 or BL2 | Float |
| SSL1/SSL2 | Float |
| WL1-WL4 | Vss |
| GSL | Float |
| ECL | Vgidl |
| CSL | Vers |

FIG. 9B

| [ERS] | Voltage |
|---|---|
| BL1 or BL2 | Vers |
| ECL | Vgidl |
| SSL1/SSL2 | Float |
| WL1-WL4 | Vss |
| GSL | Float |
| CSL | Float |

FIG. 9C

| [ERS] | Voltage |
|---|---|
| BL1 or BL2 | Vers |
| ECL2 | Vgidl |
| SSL1/SSL2 | Float |
| WL1-WL4 | Vss |
| GSL | Float |
| ECL1 | Vgidl |
| CSL | Vers |

NONVOLATILE MEMORY DEVICE, AN OPERATING METHOD THEREOF, AND A STORAGE SYSTEM INCLUDING THE NONVOLATILE MEMORY DEVICE

CROSS-REFERENCE TO RELATED APPLICATION

This application claims priority under 35 U.S.C. § 119 to Korean Patent Application No. 10-2019-0054546 filed on May 9, 2019, in the Korean Intellectual Property Office, the disclosure of which is incorporated by reference herein in its entirety.

TECHNICAL FIELD

Exemplary embodiments of the inventive concept relate to a semiconductor memory, and more particularly, to a nonvolatile memory device, an operating method thereof, and a storage device including the nonvolatile memory device.

DISCUSSION OF RELATED ART

A semiconductor memory device may be classified as a volatile memory device or a nonvolatile memory device. A semiconductor memory device is volatile when stored data disappears in the absence of power. Examples of a volatile memory device include a static random access memory (SRAM) or a dynamic RAM (DRAM). A semiconductor memory device is nonvolatile when stored data is retained in the absence of power. Examples of a nonvolatile memory device include a flash memory device, a phase-change RAM (PRAM), a magnetic RAM (MRAM), a resistive RAM (RRAM), or a ferroelectric RAM (FRAM).

Of the nonvolatile memory devices, the flash memory is widely used as a high-capacity storage medium. Nowadays, a three-dimensional flash memory device is being developed to provide increased integration. Accordingly, various techniques for controlling the highly integrated flash memory device are being developed.

SUMMARY

According to an exemplary embodiment of the inventive concept, an operating method of a nonvolatile memory device which includes a cell string including a plurality of cell transistors connected in series between a bit line and a common source line and stacked in a direction perpendicular to a substrate includes: programming an erase control transistor of the plurality of cell transistors; and after the erase control transistor is programmed, applying an erase voltage to the common source line or the bit line and applying an erase control voltage to an erase control line connected to the erase control transistor, wherein the erase control voltage is less than the erase voltage and greater than a ground voltage, and wherein the erase control transistor is between a ground selection transistor of the plurality of cell transistors and the common source line or between a string selection transistor of the plurality of cell transistors and the bit line.

According to an exemplary embodiment of the inventive concept, a nonvolatile memory device includes: a memory cell array including a cell string including a plurality of cell transistors connected in series between a bit line and a common source line and stacked in a direction perpendicular to a substrate; a row decoder configured to control the common source line and an erase control line connected to an erase control transistor of the plurality of cell transistors; an input/output circuit configured to control the bit line; and a control logic circuit, wherein, in an erase operation associated with the cell string, the control logic circuit controls the row decoder and the input/output circuit such that the erase control transistor is programmed and then controls the row decoder and the input/output circuit such that an erase voltage is applied to the common source line or the bit line and an erase control voltage is applied to the erase control line, wherein the erase control voltage is less than the erase voltage and greater than a ground voltage, and wherein the erase control transistor is between a ground selection transistor of the plurality of cell transistors and the common source line or between a string selection transistor of the plurality of cell transistors and the bit line.

According to an exemplary embodiment of the inventive concept, a storage system includes: a nonvolatile memory device including a cell string including a plurality of cell transistors connected in series between a bit line and a common source line and stacked in a direction perpendicular to a substrate; and a memory controller configured to provide a first command and a second command to the nonvolatile memory device, wherein, after programming an erase control transistor of the plurality of cell transistors in response to the first command, the nonvolatile memory device is configured to apply an erase voltage to the common source line or the bit line and an erase control voltage to an erase control line connected to the erase control transistor in response to the second command, wherein the erase control voltage is less than the erase voltage and greater than a ground voltage, and wherein the erase control transistor is between a ground selection transistor of the plurality of cell transistors and the common source line or between a string selection transistor of the plurality of cell transistors and the bit line.

BRIEF DESCRIPTION OF THE DRAWINGS

The above and other features of the inventive concept will become apparent by describing in detail exemplary embodiments thereof with reference to the accompanying drawings.

FIGS. 9A, 9B and 9C are diagrams illustrating erase biases for performing an erase operation according to exemplary embodiments of the inventive concept.

DETAILED DESCRIPTION OF THE EMBODIMENTS

Figure 1:
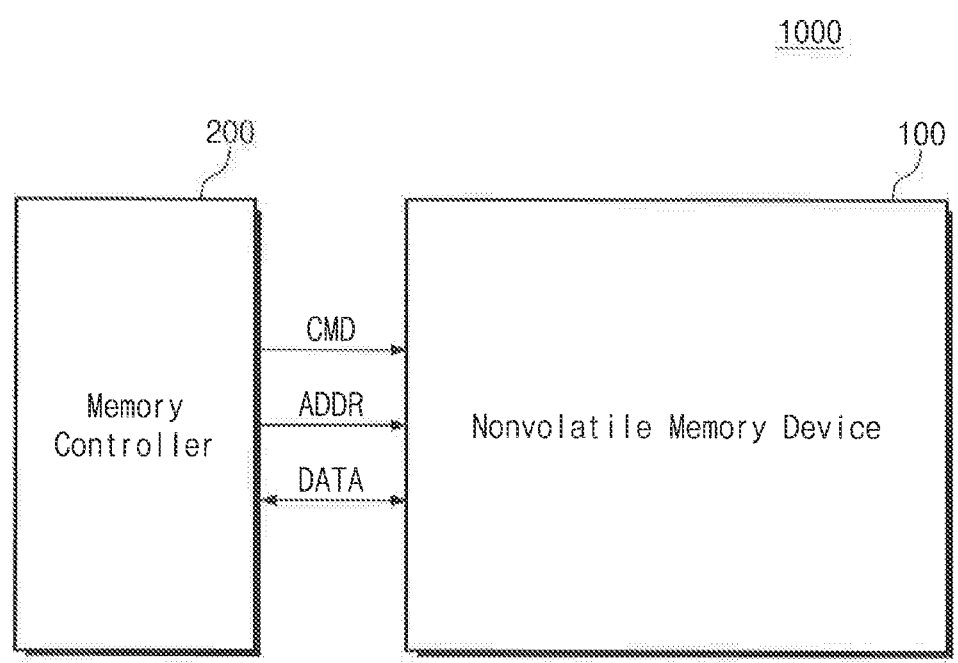
FIG. 1 is a block diagram illustrating a storage system according to an exemplary embodiment of the inventive concept.

FIG. 1 is a block diagram illustrating a storage system according to an exemplary embodiment of the inventive concept. Referring to FIG. 1, a storage system 1000 may include a nonvolatile memory device 100 and a memory controller 200. The nonvolatile memory device 100 may receive a command CMD and an address ADDR from the memory controller 200 and may perform various operations in response to the command CMD and the address ADDR, such as a program operation, a read operation, and an erase operation.

For example, the nonvolatile memory device 100 may include a flash memory device. However, the inventive concept is not limited thereto. For example, the nonvolatile memory device 100 may include a nonvolatile memory device such as a read only memory (ROM), a programmable ROM (PROM), an electrically programmable ROM (EPROM), an electrically erasable and programmable ROM (EEPROM), a phase-change random access memory (PRAM), a magnetic RAM (MRAM), a resistive RAM (RRAM), or a ferroelectric RAM (FRAM).

The memory controller 200 may provide the nonvolatile memory device 100 with the command CMD and the address ADDR to control an operation of the nonvolatile memory device 100. For example, the memory controller 200 may provide data "DATA" to the nonvolatile memory device 100 to be stored in the nonvolatile memory device 100 or may read the data "DATA" stored in the nonvolatile memory device 100. Alternatively, the memory controller 200 may erase the data "DATA" stored in the nonvolatile memory device 100.

In an exemplary embodiment of the inventive concept, the nonvolatile memory device 100 may perform an erase operation by using a gate induced drain leakage (GIDL) current. The memory controller 200 may program a part of a particular memory region of the nonvolatile memory device 100 to improve GIDL efficiency (e.g., increase the GIDL current) in an erase operation associated with the particular memory region. The memory controller 200 may provide the command CMD and the address ADDR to the nonvolatile memory device 100 to program a part of a particular memory region. In this case, the address ADDR may indicate the part of the particular memory region where the data "DATA" are to be programmed. After the data "DATA" are programmed, the memory controller 200 may provide the nonvolatile memory device 100 with the command CMD and the address ADDR for the erase operation.

In this case, the address ADDR may indicate the particular memory region. As such, the erase operation may be performed on the particular memory region of the nonvolatile memory device 100.

Below, a configuration and an operation of the nonvolatile memory device 100 for improving GIDL efficiency (e.g., increasing the GIDL current) will be more fully described with reference to accompanying drawings.

Figure 2:
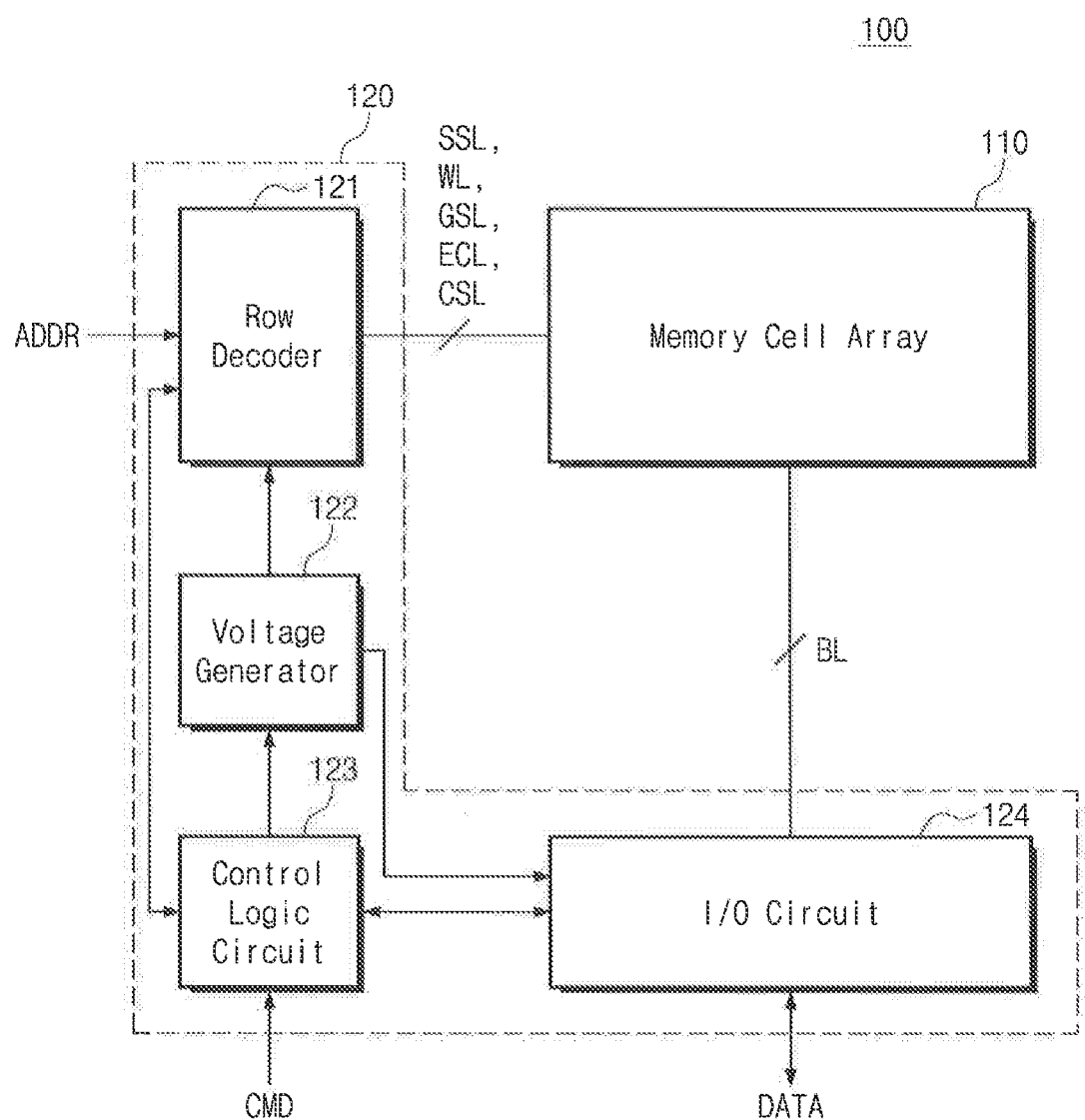
FIG. 2 is a block diagram illustrating a nonvolatile memory device of FIG. 1, according to an exemplary embodiment of the inventive concept.

FIG. 2 is a block diagram illustrating a nonvolatile memory device of FIG. 1, according to an exemplary embodiment of the inventive concept. Referring to FIG. 2, the nonvolatile memory device 100 may include a memory cell array 110 and a peripheral circuit 120. For convenience of description, below, the following description will be given under the condition that the nonvolatile memory device 100 is a NAND flash memory device, but the inventive concept is not limited thereto.

The memory cell array 110 may include a plurality of memory blocks. Each of the memory blocks may include a plurality of cell strings. Each of the plurality of cell strings may include a plurality of serially connected cell transistors, which are connected to a string selection line SSL, a word line WL, a ground selection line GSL, an erase control line ECL, and a common source line CSL.

In an exemplary embodiment of the inventive concept, the cell transistors of the memory cell array 110 may be stacked in a direction that is perpendicular to a semiconductor substrate. In other words, the memory cell array 110 may include three-dimensional memory blocks.

The peripheral circuit 120 may include a row decoder 121, a voltage generator 122, a control logic circuit 123, and an input/output circuit 124. In an exemplary embodiment of the inventive concept, the memory cell array 110 may be formed in a cell area of the semiconductor substrate, and the peripheral circuit 120 may be formed in a peripheral area, which is physically separated from the cell area, of the semiconductor substrate. Alternatively, the peripheral circuit 120 may be formed on the semiconductor substrate, and the memory cell array 110 may be stacked on the peripheral circuit 120. In other words, the nonvolatile memory device 100 may have a cell-on-peripheral (COP) structure. However, the inventive concept is not limited thereto. For example, the nonvolatile memory device 100 may be implemented in various shapes.

The row decoder 121 may be connected to the memory cell array 110 through the string selection line SSL, the word line WL, the ground selection line GSL, the erase control line ECL, and the common source line CSL. The row decoder 121 may receive the address ADDR from an external device (e.g., the memory controller 200 of FIG. 1 or a host device). In an exemplary embodiment of the inventive concept, the address ADDR may include various address information such as a block address, a row address, and a column address. The row decoder 121 may decode the received address ADDR to control the string selection line SSL, the word line WL, the ground selection line GSL, the erase control line ECL, and the common source line CSL.

The voltage generator 122 may be configured to generate various voltages (e.g., a program voltage, a verification voltage, a pass voltage, and an erase voltage) used during the operation of the nonvolatile memory device 100. The voltages generated by the voltage generator 122 may be provided to the row decoder 121 and the input/output circuit 124.

The control logic circuit 123 may receive the command CMD from the external device (e.g., the memory controller 200 of FIG. 1 or a host device) and may control the row decoder 121, the voltage generator 122, and the input/output circuit 124 in response to the command CMD.

The input/output circuit 124 may be connected to the memory cell array 110 through a plurality of bit lines BL. The input/output circuit 124 may read the data "DATA" stored in the memory cell array 110 through the plurality of bit lines BL and may output the read data "DADA" to the external device. Alternatively, the input/output circuit 124 may receive the data "DATA" from the external device and may store the received data "DATA" in the memory cell array 110 through the plurality of bit lines BL.

In an exemplary embodiment of the inventive concept, the nonvolatile memory device 100 may use a GIDL current for an erase operation associated with a cell string of the memory cell array 110. The GIDL current may be generated by a cell transistor connected to the erase control line ECL from among cell transistors of the cell string. In other words, as the erase control line ECL is controlled by the row decoder 121, the GIDL current may be generated, and the erase operation may be performed on the cell string based on the GIDL current.

In an exemplary embodiment of the inventive concept, for the erase operation associated with the cell string, the nonvolatile memory device 100 may receive a program command PGM for programming a particular cell transistor (e.g., a first cell transistor) of the cell string and an erase command ERS for erasing the cell transistors. In response to the program command PGM, the control logic circuit 123 may control the row decoder 121, the voltage generator 122, and the input/output circuit 124 such that the first cell transistor is programmed. As such, the row decoder 121 and the input/output circuit 124 may control the string selection line SSL, the word line WL, the ground selection line GSL, the erase control line ECL, and the common source line CSL to program the first cell transistor. In response to the erase command ERS, the control logic circuit 123 may control the row decoder 121, the voltage generator 122, and the input/output circuit 124 such that the cell transistors of the cell string are erased. As such, the row decoder 121 and the input/output circuit 124 may control the string selection line SSL, the word line WL, the ground selection line GSL, the erase control line ECL, and the common source line CSL to erase the cell transistors.

In the erase operation associated with the cell string, the GIDL current may be increased by programming the first cell transistor before the erase operation. In this case, the GIDL current of a desired magnitude may be generated, and the erase operation may be normally performed on the cell transistors.

Figure 3A:
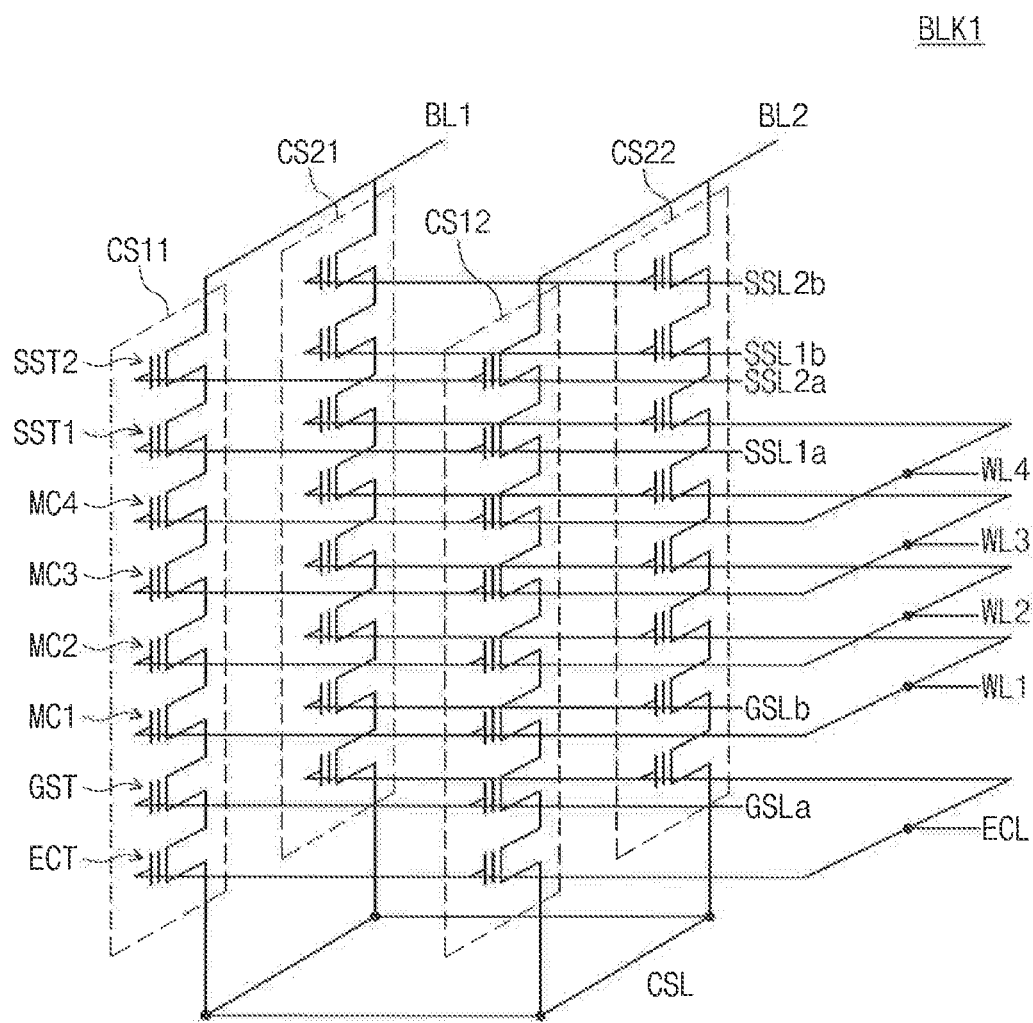
FIGS. 3A, 3B and 3C are circuit diagrams illustrating a memory block included in a memory cell array of FIG. 2, according to an exemplary embodiment of the inventive concept.
Figure 3B:
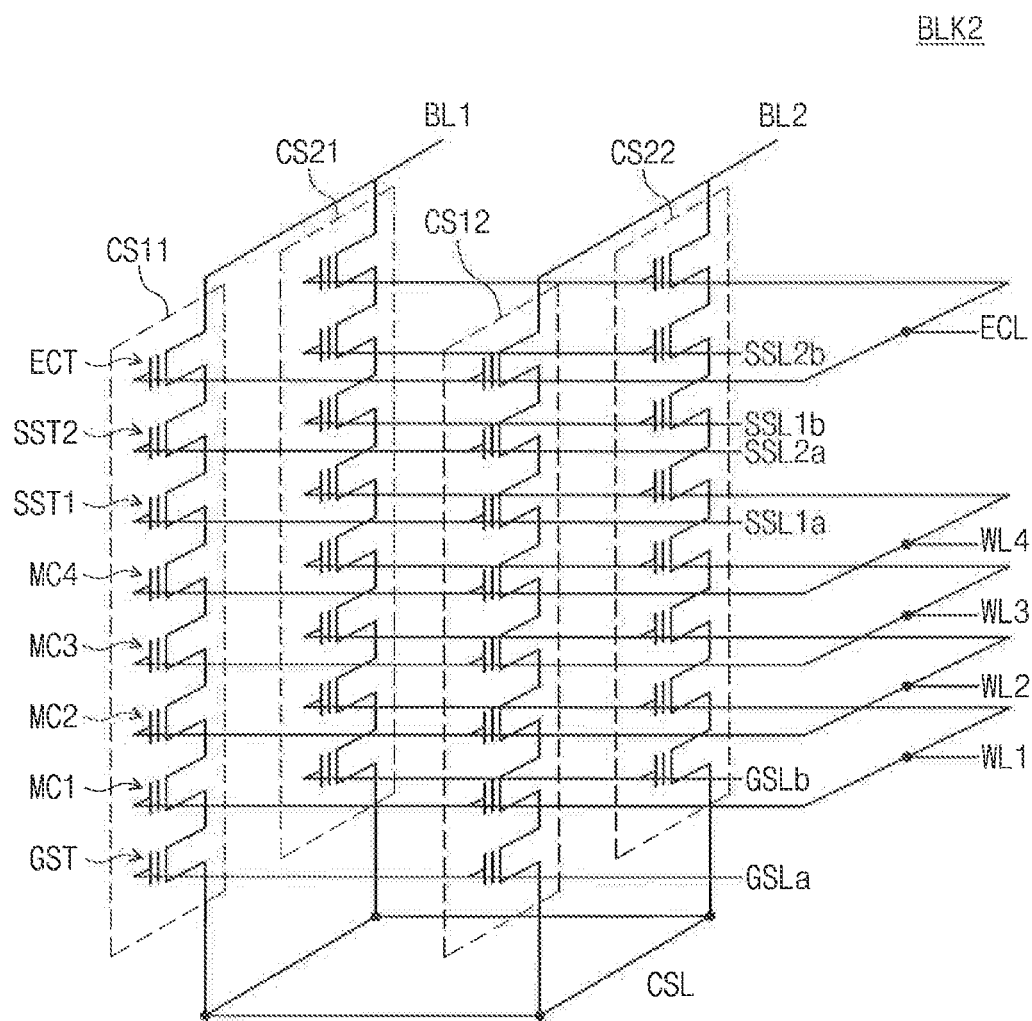
Figure 3B:
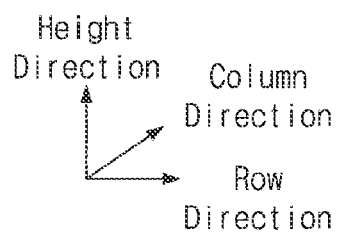
Figure 3C:
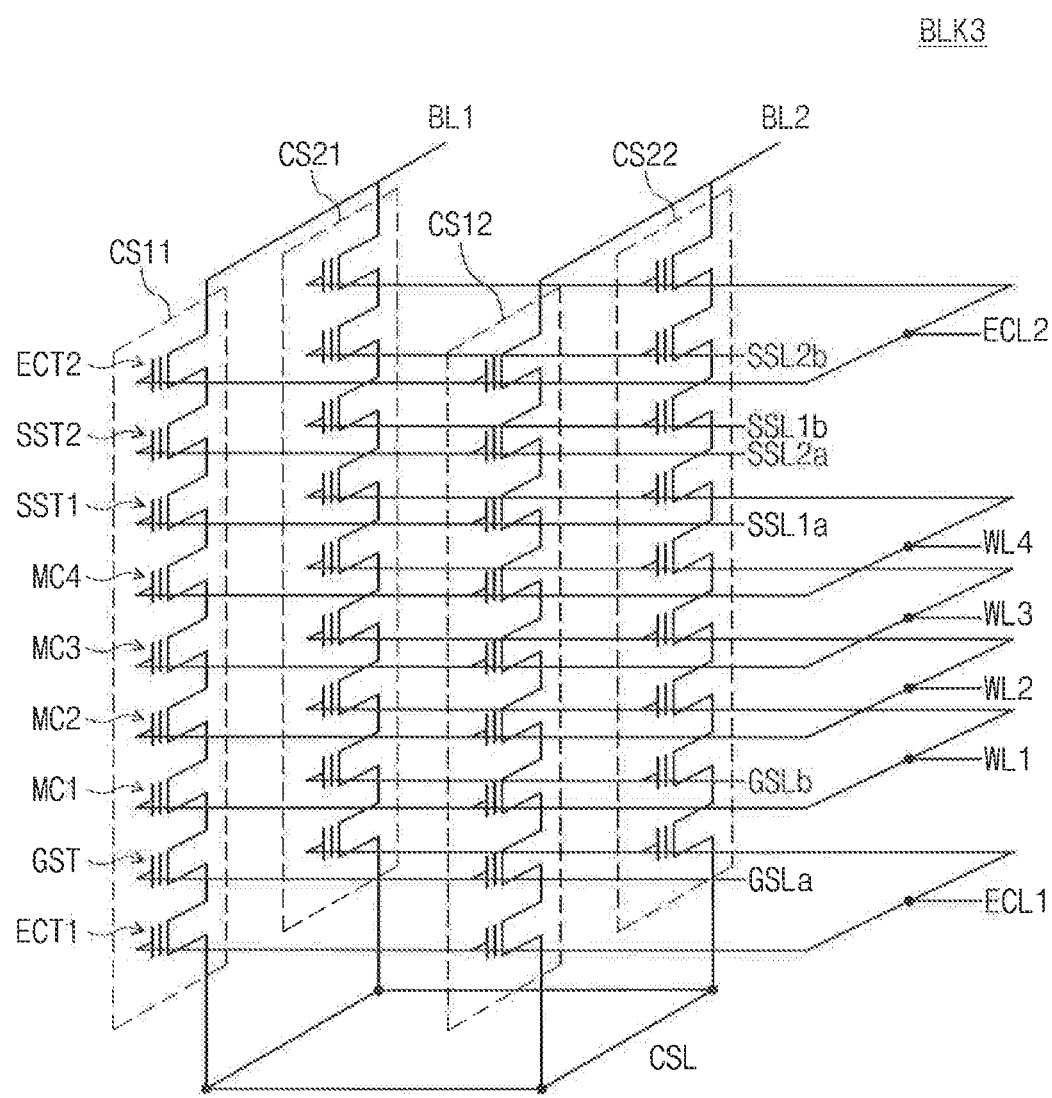

FIGS. 3A to 3C are circuit diagrams illustrating a memory block included in a memory cell array of FIG. 2, according to an exemplary embodiment of the inventive concept. Structures of first, second and third memory blocks BLK1, BLK2 and BLK3 of FIGS. 3A to 3C are exemplary structures of a three-dimensional memory block, and the inventive concept is not limited thereto.

Referring to FIG. 3A, the first memory block BLK1 may include a plurality of cell strings CS11, CS12, CS21, and CS22. The cell strings CS11, CS12, CS21, and CS22 may be arranged in a row direction and a column direction. For brevity of illustration, four cell strings CS11, CS12, CS21, and CS22 are illustrated in FIG. 3A, but the inventive concept is not limited thereto. For example, the number of cell strings may increase or decrease in the row direction or the column direction.

Cell strings belonging to the same column may be connected to the same bit line. For example, the cell strings CS11 and CS21 may be connected to a first bit line BL1, and the cell strings CS12 and CS22 may be connected to a second bit line BL2.

Each of the plurality of cell strings CS11, CS12, CS21, and CS22 may include a plurality of cell transistors, each of which includes a charge trap flash (CTF) memory cell. The plurality of cell transistors may be stacked in a height direction that is a direction perpendicular to a plane (e.g., a semiconductor substrate) defined by the row direction and the column direction.

In each cell string, the plurality of cell transistors may be connected in series between a corresponding bit line (e.g., BL1 or BL2) and the common source line CSL. For example, in each cell string, the plurality of cell transistors may include string selection transistors SST1 and SST2, memory cells MC1, MC2, MC3 and MC4, a ground selection transistor GST, and an erase control transistor ECT. The serially connected string selection transistors SST1 and SST2 may be provided between the serially connected memory cells MC1 to MC4 and the corresponding bit line (e.g., BL1 or BL2). The ground selection transistor GST may be provided between the serially connected memory cells MC1 to MC4 and the erase control transistor ECT. The erase control transistor ECT may be provided between the ground selection transistor GST and the common source line CSL.

In the plurality of cell strings CS11, CS12, CS21, and CS22, memory cells positioned at the same height from among the memory cells MC1 to MC4 may share the same word line. For example, the first memory cells MC1 of the plurality of cell strings CS11, CS12, CS21, and CS22 may be positioned at the same height from a substrate and may share a first word line WL1. The second memory cells MC2 of the plurality of cell strings CS11, CS12, CS21, and CS22 may be positioned at the same height from the substrate and may share a second word line WL2. Likewise, the third memory cells MC3 of the plurality of cell strings CS11, CS12, CS21, and CS22 may be positioned at the same height from the substrate and may share a third word line WL3, and the fourth memory cells MC4 of the plurality of cell strings CS11, CS12, CS21, and CS22 may be positioned at the same height from the substrate and may share a fourth word line WL4.

In the plurality of cell strings CS11, CS12, CS21, and CS22, string selection transistors positioned at the same height and belonging to the same row may share the same string selection line. For example, the string selection transistors SST1 of the cell strings CS11 and CS12 may share a string selection line SSL1a, and the string selection transistors SST2 of the cell strings CS11 and CS12 may share a string selection line SSL2a. The string selection transistors SST1 of the cell strings CS21 and CS22 may share a string selection line SSL1b, and the string selection transistors SST2 of the cell strings CS21 and CS22 may share a string selection line SSL2b.

In the plurality of cell strings CS11, CS12, CS21, and CS22, ground selection transistors belonging to the same row from among the ground selection transistors GST may share the same ground selection line. For example, the ground selection transistors GST of the cell strings CS11 and CS12 may be connected to a ground selection line GSLa, and the ground selection transistors GST of the cell strings CS21 and CS22 may share a ground selection line GSLb. In addition, the ground selection transistors GST of the plurality of cell strings CS11, CS12, CS21, and CS22 may share the same ground selection line.

The erase control transistors ECT of the plurality of cell strings CS1, CS12, CS21, and CS22 may share the same erase control line ECL. In an exemplary embodiment of the inventive concept, the erase control transistors ECT may be configured to generate the GIDL current in an erase operation associated with the first memory block BLK1.

The first memory block BLK1 illustrated in FIG. 3A is merely exemplary. For example, the number of cell strings may increase or decrease, and the number of rows of cell strings and the number of columns of cell strings may increase or decrease depending on the number of cell strings. In addition, the number of cell transistors (e.g., SST, MC, GST, and/or ECT) of the first memory block BLK1 may increase or decrease. For example, the cell string CS11 may include two or more erase control transistors ECT between the ground selection transistor GST and the common source line CSL. A height of the first memory block BLK1 may increase or decrease depending on the number of cell transistors. In addition, as the number of cell transistors increases or decreases, the number of lines (e.g., GSL, WL, DWL, and/or SSL) connected to the cell transistors may increase or decrease.

Referring to FIG. 3B, the second memory block BLK2 may include the plurality of cell strings CS11, CS12, CS21, and CS22. The plurality of cell strings CS11, CS12, CS21, and CS22 may be arranged in the row direction and the column direction. Cell strings belonging to the same column may be connected to the same bit line. For example, the cell strings CS11 and CS21 may be connected to the first bit line BL1, and the cell strings CS12 and CS22 may be connected to the second bit line BL2.

Each of the plurality of cell strings CS11, CS12, CS21, and CS22 may include a plurality of cell transistors. In each cell string, the plurality of cell transistors may be connected in series between a corresponding bit line and the common source line CSL. In an exemplary embodiment of the inventive concept, in each cell string, the plurality of cell transistors may include the erase control transistor ECT, the string selection transistors SST1 and SST2, the memory cells MC1 to MC4, and the ground selection transistor GST. The cell transistors in each cell string may be connected to corresponding lines (e.g., ECL, SSL1a, SSL1b, SSL2a, SSL2b, WL1 to WL4, GSLa, and GSLb), respectively.

Unlike the first memory block BLK1 of FIG. 3A, the second memory block BLK2 of FIG. 3B may include the erase control transistor ECT that is provided between the serially connected string selection transistors SST1 and SST2 and the corresponding bit line (e.g., BL1 or BL2). In each cell string, the string selection transistors SST1 and SST2 may be provided between the erase control transistor ECT and the serially connected memory cells MC1 to MC4. The ground selection transistor GST may be provided between the serially connected memory cells MC1 to MC4 and the common source line CSL. In an exemplary embodiment of the inventive concept, the erase control transistors ECT may be configured to generate the GIDL current in an erase operation associated with the second memory block BLK2.

Referring to FIG. 3C, the third memory block BLK3 may include the plurality of cell strings CS11, CS12, CS21, and CS22. The plurality of cell strings CS11, CS12, CS21, and CS22 may be arranged in the row direction and the column direction. Cell strings belonging to the same column may be connected to the same bit line. For example, the cell strings CS11 and CS21 may be connected to the first bit line BL1, and the cell strings CS12 and CS22 may be connected to the second bit line BL2.

Each of the plurality of cell strings CS11, CS12, CS21, and CS22 may include a plurality of cell transistors. In each cell string, the plurality of cell transistors may be connected in series between a corresponding bit line and the common source line CSL. In an exemplary embodiment of the inventive concept, in each cell string, the plurality of cell transistors may include erase control transistors ECT1 and ECT2, the string selection transistors SST1 and SST2, the memory cells MC1 to MC4, and the ground selection transistor GST. The cell transistors in each cell string may be connected to corresponding lines (e.g., ECL1, ECL2, SSL1a, SSL1b, SSL2a, SSL2b, WL1 to WL4, GSLa, and GSLb), respectively.

Unlike the first memory block BLK1 of FIG. 3A and the second memory block BLK2 of FIG. 3B, the third memory block BLK3 of FIG. 3C may include the erase control transistors ECT1 and ECT2 that are provided at different heights. In each cell string, the erase control transistor ECT2 may be provided between the corresponding bit line (e.g., BL1 or BL2) and the serially connected string selection transistors SST1 and SST2. The string selection transistors SST1 and SST2 may be provided between the erase control transistor ECT2 and the serially connected memory cells MC1 to MC4. The ground selection transistor GST may be provided between the serially connected memory cells MC1 to MC4 and the erase control transistor ECT1. The erase control transistor ECT1 may be provided between the ground selection transistor GST and the common source line CSL. In other words, the erase control transistor ECT1 may be disposed closer to the common source line CSL than the erase control transistor ECT2. In an exemplary embodiment of the inventive concept, the erase control transistors ECT1 and ECT2 may generate the GIDL current in an erase operation associated with the third memory block BLK3.

As described above, a cell string included in the memory cell array 110 of FIG. 2 may include at least one erase control transistor ECT. The erase control transistor ECT may be provided between the ground selection transistor GST and the common source line CSL or may be provided between a string selection transistor SST and a bit line BL. However, the inventive concept is not limited thereto.

Figure 4:
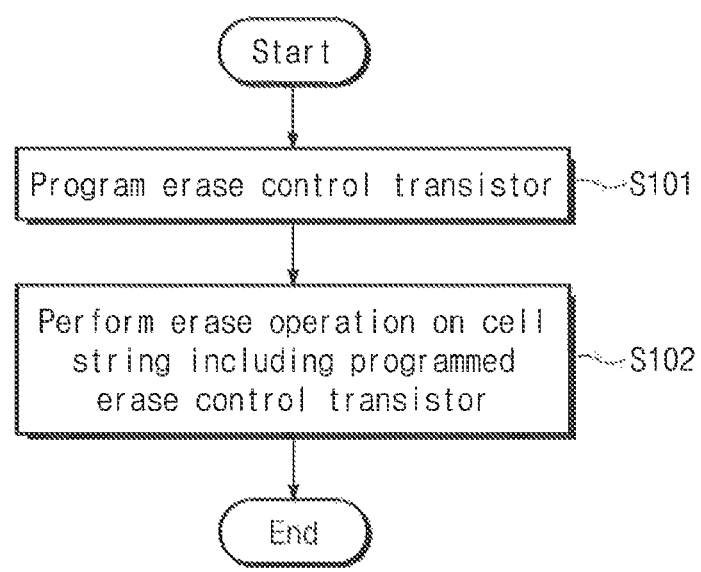
FIG. 4 is a flowchart illustrating an erase operation associated with a cell string included in a memory cell array of FIG. 2, according to an exemplary embodiment of the inventive concept.

FIG. 4 is a flowchart illustrating an erase operation associated with a cell string included in a memory cell array of FIG. 2, according to an exemplary embodiment of the inventive concept. Referring to FIGS. 2 to 4, in operation S101, the nonvolatile memory device 100 may program the erase control transistor ECT. For example, the nonvolatile memory device 100 may program the erase control transistor ECT based on the data "DATA" provided from the outside or may program the erase control transistor ECT based on data (e.g., dummy data) having a given value.

For example, the nonvolatile memory device 100 may receive the command CMD, the address ADDR, and the data "DATA" to program the erase control transistor ECT. The control logic circuit 123 may control the row decoder 121, the voltage generator 122, and the input/output circuit 124 in response to the command CMD. The voltage generator 122 may provide the row decoder 121 and the input/output circuit 124 with various voltages for a program operation. The row decoder 121 may apply relevant voltages to lines (e.g., SSL, WL, GSL, ECL, and CSL) such that the erase control transistor ECT corresponding to the address ADDR is programmed. In addition, the input/output circuit 124 may apply a voltage to a relevant bit line BL. According to the above bias condition, the erase control transistor ECT may be programmed.

For example, as illustrated in FIG. 3C, when each of the plurality of cell strings CS11, CS12, CS21, and CS22 includes the plurality of erase control transistors ECT1 and ECT2, the nonvolatile memory device 100 may program at least one of the plurality of erase control transistors ECT1 and ECT2. For example, the nonvolatile memory device 100 may program only the erase control transistor ECT1 based on the command CMD and the address ADDR. In addition, the nonvolatile memory device 100 may program only the erase control transistor ECT2 based on the command CMD and the address ADDR. Alternatively, the nonvolatile memory device 100 may program the erase control transistors ECT1 and ECT2 based on the command CMD and the address ADDR.

After the erase control transistor ECT is programmed, in operation S102, the nonvolatile memory device 100 may perform an erase operation on a cell string including the erase control transistor ECT. For example, the nonvolatile memory device 100 may erase memory cells included in the cell string. For example, the nonvolatile memory device 100 may erase memory cells MC1 to MC4 included in cell string CS11 when the erase control transistor ECT of the cell string CS11 is programmed. The erase operation may be performed in the unit of a memory block including the cell string, but the inventive concept is not limited thereto.

For example, the nonvolatile memory device 100 may receive the command CMD and the address ADDR to erase the memory cells of the cell string. When the erase operation is performed in the unit of a memory block, the address ADDR may correspond to a memory block in which the cell string is included. The control logic circuit 123 may control the row decoder 121, the voltage generator 122, and the input/output circuit 124 in response to the command CMD. The voltage generator 122 may provide the row decoder 121 and the input/output circuit 124 with various voltages for the erase operation. The row decoder 121 may apply relevant voltages to lines (e.g., SSL, WL, GSL, ECL, and CSL) such that the memory block including the cell string is erased. In addition, the input/output circuit 124 may apply voltages to bit lines of the memory block. According to the above bias condition, the memory cells of the cell string may be erased.

An operation of programming the erase control transistor ECT, in other words, operation S101 of FIG. 4 will be more fully described with reference to FIGS. 5 to 8. For convenience of description, the program operation will be described under the condition that the erase control transistor ECT is provided between the ground selection transistor GST and the common source line CSL as illustrated in FIG. 3A, but the inventive concept is not limited thereto.

Figure 5:
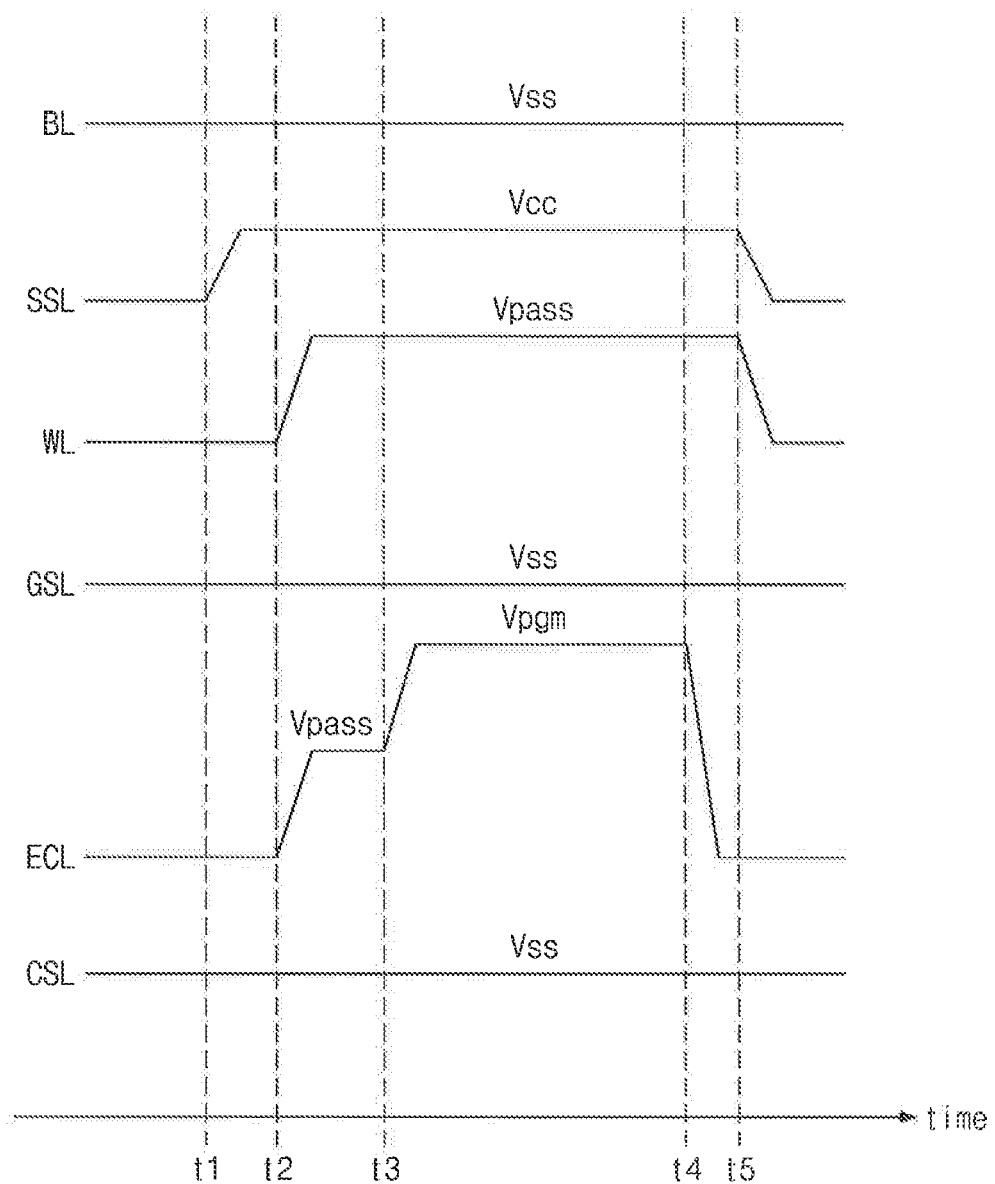
FIG. 5 is a timing diagram illustrating voltages applied to program an erase control transistor according to an exemplary embodiment of the inventive concept.

FIG. 5 is a timing diagram illustrating voltages applied to program an erase control transistor according to an exemplary embodiment of the inventive concept. Referring to FIG. 5, the nonvolatile memory device 100 may apply voltages of FIG. 5 to lines BL, SSL, WL, GSL, ECL, and CSL to program the erase control transistor ECT.

For example, referring to FIGS. 2 and 5, the bit line BL, the ground selection line GSL, and the common source line CSL may be maintained at a level of a ground voltage Vss. At a first time t1, the row decoder 121 may apply a power supply voltage Vcc to the string selection line SSL. The power supply voltage Vcc may be a high voltage for turning on a string selection transistor connected to the string selection line SSL. As the string selection transistor is turned on, a channel connected to the string selection line SSL may be initialized. In other words, a channel voltage of a cell string may be set to a voltage level corresponding to the ground voltage Vss.

At a second time t2, the row decoder 121 may apply a pass voltage Vpass to all of the word lines WL and the erase control line ECL. At a third time t3, the row decoder 121 may apply a program voltage Vpgm to the erase control line ECL. As illustrated in FIG. 5, the program voltage Vpgm may be greater than the pass voltage Vpass. According to the above bias condition, the erase control transistor ECT connected to the erase control line ECL may be programmed. At a fourth time t4, the program voltage Vpgm applied to the erase control line ECL may be recovered. At a fifth time t5, all the applied voltages may be recovered.

Figure 6:
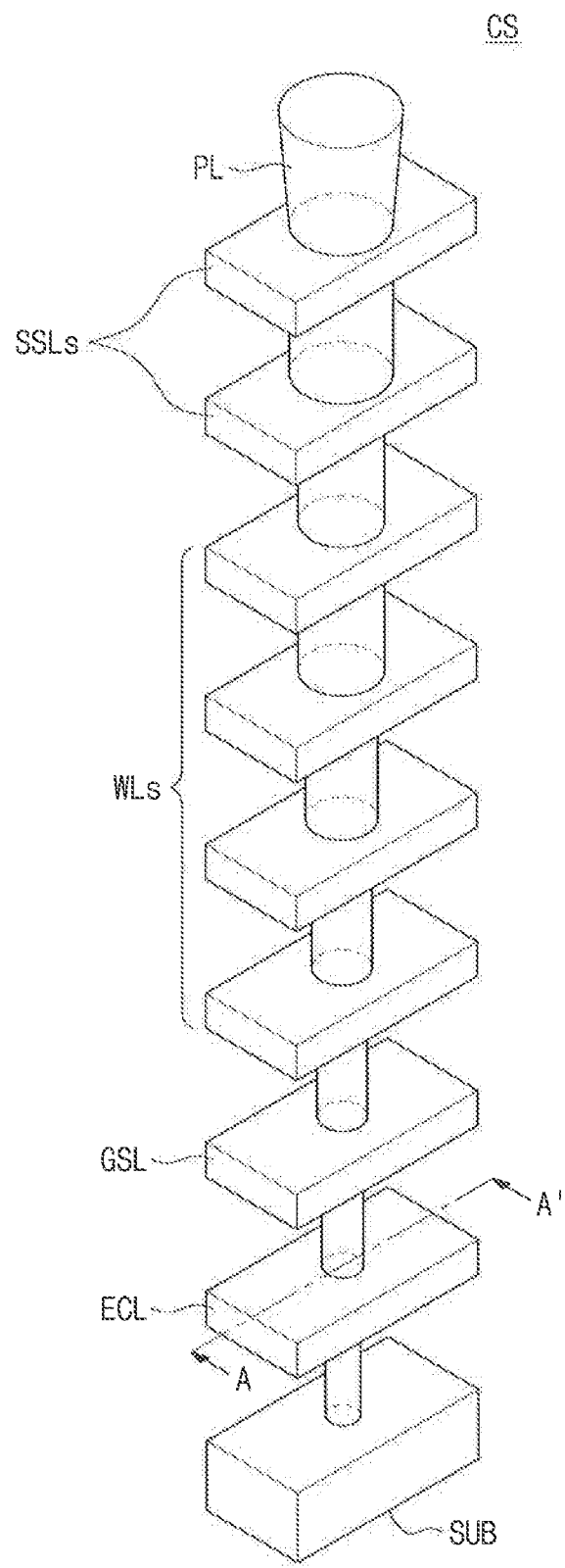
FIG. 6 is a view illustrating a structure of a cell string in a first memory block illustrated in FIG. 3A, according to an exemplary embodiment of the inventive concept.

FIG. 6 is a view illustrating a structure of a cell string in a first memory block illustrated in FIG. 3A, according to an exemplary embodiment of the inventive concept. Referring to FIGS. 3A and 6, a cell string CS may include a pillar PL that extends in a direction perpendicular to a substrate SUB and is in contact with the substrate SUB. Each of the erase control line ECL, the ground selection line GSL, the word lines WLs, and the string selection lines SSLs may be formed of a conductive material, for example, a metal material. The erase control line ECL, the ground selection line GSL, the word lines WLs, and the string selection lines SSLs may be arranged parallel to the substrate SUB. The pillar PL may be in contact with the substrate SUB through the conductive materials that form the string selection lines SSLs, the word lines WLs, the ground selection line GSL, and the erase control line ECL. In an exemplary embodiment of the inventive concept, as a distance from the substrate SUB decreases, the width of the pillar PL or the cross-sectional area of the pillar PL parallel to an upper surface of the substrate SUB may decrease. In other words, the width of the pillar PL is greater near the string selection lines SSLs than the width of the pillar PL near the substrate SUB.

Figure 7:
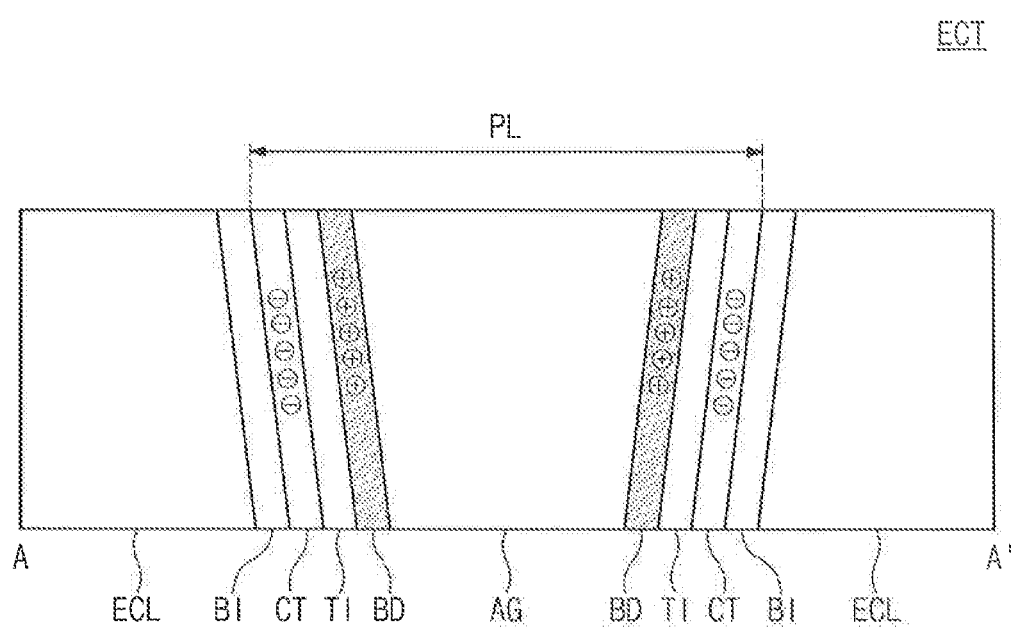
FIG. 7 is a view illustrating a structure of an erase control transistor according to an exemplary embodiment of the inventive concept.

FIG. 7 is a view illustrating a structure of an erase control transistor according to an exemplary embodiment of the inventive concept. For example, FIG. 7 is a cross-sectional view of the erase control transistor ECT corresponding to one erase control line ECL, which is taken along a line A-A' of FIG. 6. The pillar PL may include a cylindrical body BD. An air gap AG may be provided in the body BD. The body BD may include P-type silicon and may be a region where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the erase control line ECL and the pillar PL. The body BD, the tunnel insulating layer TI, the charge trap layer CT, the blocking insulating layer BI, and the erase control line ECL may constitute a charge trap type transistor that is formed in a direction perpendicular to the substrate SUB or to an upper surface of the substrate SUB. The string selection transistors SST1 and SST2, the memory cells MC1 to MC4, and the ground selection transistor GST of the cell string CS may have the same structure as the erase control transistor ECT.

In an exemplary embodiment of the inventive concept, when the erase control transistor ECT is programmed, the number of electrons trapped in the charge trap layer CT may be increased. In this case, in an erase operation, the trapped electrons may allow an electric field of the tunnel insulating layer TI to increase, and band to band tunneling (BTBT) may be activated. As such, the number of holes that are supplied into the channel formed in the body BD may be increased, and the GIDL current generated at the erase control transistor ECT may be increased. Accordingly, a body (BD) voltage of the cell string CS may be increased.

Figure 8:
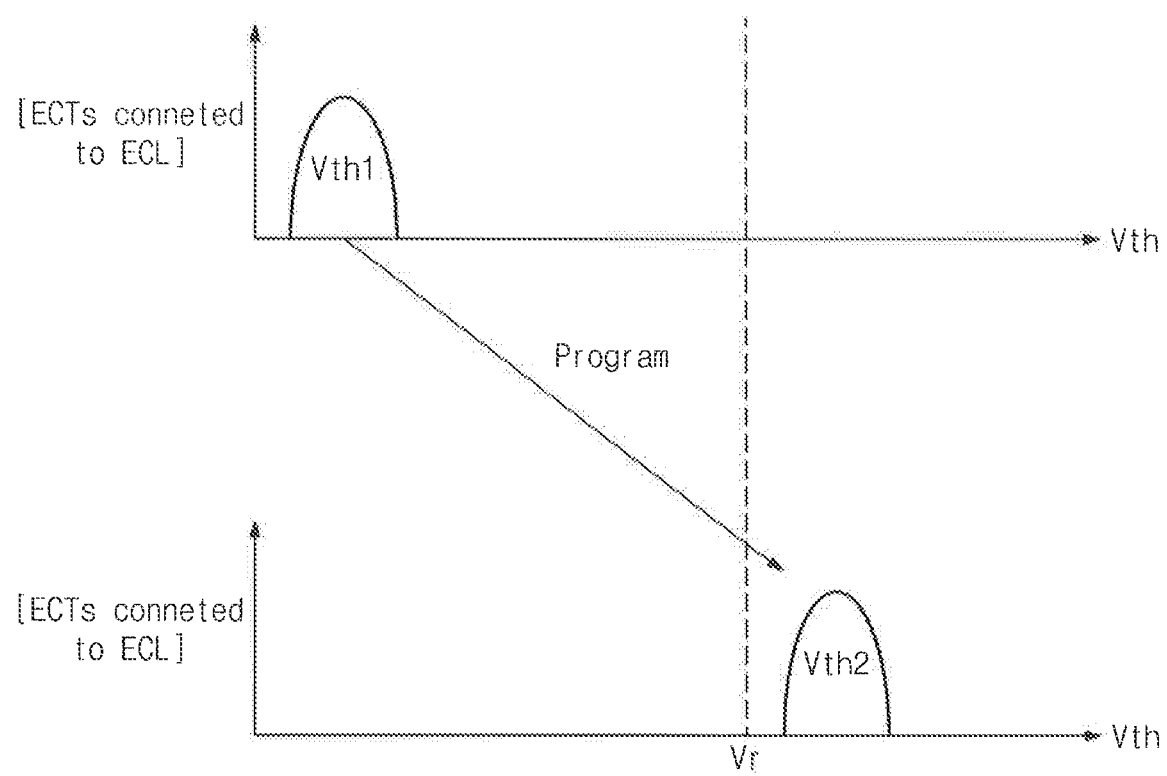
FIG. 8 is a diagram illustrating a threshold voltage distribution of erase control transistors changed through a program operation according to an exemplary embodiment of the inventive concept.

FIG. 8 is a diagram illustrating a threshold voltage distribution of erase control transistors changed through a program operation according to an exemplary embodiment of the inventive concept. Referring to FIG. 8, before erase control transistors are programmed, the erase control transistors connected to the erase control line ECL may have a first threshold voltage distribution Vth1. When the erase control transistors are programmed according to the program operation described with reference to FIGS. 4 to 7, the erase control transistors may have a second threshold voltage distribution Vth2. In this case, the second threshold voltage distribution Vth2 may be higher in level than the first threshold voltage distribution Vth1.

The program operation according to an exemplary embodiment of the inventive concept may be performed on the erase control transistor ECT such that the second threshold voltage distribution Vth2 is a reference voltage Vr or greater. The reference voltage Vr may be a voltage that allows the GIDL current flowing at the erase control transistor ECT to be a reference current or greater. In other words, when a threshold voltage of the erase control transistor ECT is the reference voltage Vr or greater, the GIDL current flowing at the erase control transistor ECT may be increased to the reference current or greater. In an exemplary embodiment of the inventive concept, after the erase control transistor ECT is programmed, a threshold voltage of the erase control transistor ECT may be verified based on the reference voltage Vr.

As described above, the nonvolatile memory device 100 according to an exemplary embodiment of the inventive concept may program an erase control transistor(s) of a cell string to be erased. As the erase control transistor is programmed, the number of holes that are supplied to a channel of the cell string may be increased, and the GIDL current generated at the erase control transistor ECT may be increased. Accordingly, a channel voltage having a magnitude to effectuate an erase operation may be provided.

Below, an erase operation associated with a cell string, in other words, operation S102 of FIG. 4 will be more fully described with reference to FIGS. 9A to 11.

FIGS. 9A to 9C are diagrams illustrating erase biases for performing an erase operation according to exemplary embodiments of the inventive concept. For example, FIG. 9A illustrates an example of an erase bias for performing an erase operation on a cell string having the structure of FIG. 3A. FIG. 9B illustrates an example of an erase bias for performing an erase operation on a cell string having the structure of FIG. 3B. FIG. 9C illustrates an example of an erase bias for performing an erase operation on a cell string having the structure of FIG. 3C.

Referring to FIGS. 2, 3A, and 9A, after the erase control transistor ECT provided between the ground selection transistor GST and the common source line CSL is programmed, the nonvolatile memory device 100 may bias lines BL1, BL2, SSL1, SSL2, WL1 to WL4, GSL, ECL, and CSL to perform an erase operation on the cell string (e.g., a memory block) including the erase control transistor ECT.

For example, the bit line BL1 or BL2 connected to the cell string, the string selection lines SSL1 and SSL2 connected to the string selection transistors SST1 and SST2, and the ground selection line GSL connected to the ground selection transistor GST may be floated. The row decoder 121 may apply the ground voltage Vss to the word lines WL1 to WL4 connected to the memory cells MC1 to MC4. The row decoder 121 may apply an erase voltage Vers to the common source line CSL connected to the cell string. The row decoder 121 may apply a GIDL voltage Vgid1 to the erase control line ECL connected to the erase control transistor ECT. Here, the GIDL voltage Vgid1 may be smaller than the erase voltage Vers and may be greater than the ground voltage Vss.

According to the above erase bias, a channel of the cell string may be charged, and holes may be supplied from the charged channel to the charge trap layers of the memory cells MC1 to MC4 through the tunnel insulating layer. The supplied holes may be bonded to electrons of the charge trap layers of the memory cells MC1 to MC4. In this case, charges of the charge trap layers may be decreased, and thus, the memory cells MC1 to MC4 of the cell string may be erased.

The GIDL voltage Vgid1 applied to the erase control line ECL may be a specified voltage. When the GIDL voltage Vgid1 is greater than the specified voltage, an electric field of the blocking insulating layer BI of FIG. 7 may be increased. In this case, back-tunneling may be increased, and thus, time dependent dielectric breakdown (TDDB) of the erase control transistor ECT may be decreased. Thus, according to an exemplary embodiment of the inventive concept, the GIDL voltage Vgid1 applied to the erase control line ECL may be a voltage that minimizes an increase in an electric field of the blocking insulating layer BI of the erase control transistor ECT. Accordingly, the TDDB of the erase control transistor ECT may be improved.

Referring to FIGS. 2, 3B, and 9B, after the erase control transistor ECT provided between the string selection transistors SST and SST2 and the bit line BL1 or BL2 is programmed, the nonvolatile memory device 100 may bias lines BL1, BL2, ECL, SSL1, SSL2, WL1 to WL4, GSL, and CSL to perform an erase operation on a cell string including the erase control transistor ECT.

For example, the string selection lines SSL1 and SSL2 connected to the string selection transistors SST1 and SST2 and the ground selection line GSL connected to the ground selection transistor GST may be floated. The row decoder 121 may apply the ground voltage Vss to the word lines WL1 to WL4 connected to the memory cells MC1 to MC4. The common source line CSL connected to the cell string may be floated. The row decoder 121 may apply the GIDL voltage Vgid1 to the erase control line ECL connected to the erase control transistor ECT. The GIDL voltage Vgid1 of FIG. 9B is similar to the GIDL voltage Vgid1 of FIG. 9A, and thus, an additional description will be omitted to avoid redundancy. The input/output circuit 124 may apply the erase voltage Vers to the bit line BL1 or BL2 connected to the cell string. As described with reference to FIG. 9A, the memory cells MC1 to MC4 of the cell string may be erased under the erase bias of FIG. 9B.

Referring to FIGS. 2, 3C, and 9C, after the erase control transistor ECT provided between the ground selection transistor GST and the common source line CSL and the erase control transistor ECT2 provided between the string selection transistors SST1 and SST2 and the bit line BL1 or BL2 are programmed, the nonvolatile memory device 100 may bias lines BL1, BL2, ECL2, SSL1, SSL2, WL1 to WL4, GSL, ECL1, and CSL to perform an erase operation on a cell string including the erase control transistor ECT.

For example, the string selection lines SSL1 and SSL2 connected to the string selection transistors SST1 and SST2 and the ground selection line GSL connected to the ground selection transistor GST may be floated. The row decoder 121 may apply the ground voltage Vss to the word lines WL1 to WL4 connected to the memory cells MC1 to MC4. The row decoder 121 may apply the erase voltage Vers to the common source line CSL connected to the cell string. The row decoder 121 may apply the GIDL voltage Vgid1 to the erase control lines ECL1 and ECL2 connected to the erase control transistors ECT1 and ECT2. The GIDL voltage Vgid1 of FIG. 9C is similar to the GIDL voltage Vgid1 of FIG. 9A, and thus, an additional description will be omitted to avoid redundancy. The input/output circuit 124 may apply the erase voltage Vers to the bit line BL1 or BL2 connected to the cell string. As described with reference to FIG. 9A, the memory cells MC1 to MC4 of the cell string may be erased under the erase bias of FIG. 9C.

The example described with reference to FIG. 9C, has the erase voltage Vers being applied to both the bit line BL1 or BL2 and the common source line CSL in the cell string of FIG. 3C. However, as described with reference to FIG. 9A or 9B, with regard to the cell string of FIG. 3C, the erase voltage Vers may be applied to one of the bit line BL or BL2 and the common source line CSL, and the other may be floated. For example, erase voltage Vers may be applied to the bit line BL1 and the common source line CSL may be floated.

Figure 10:
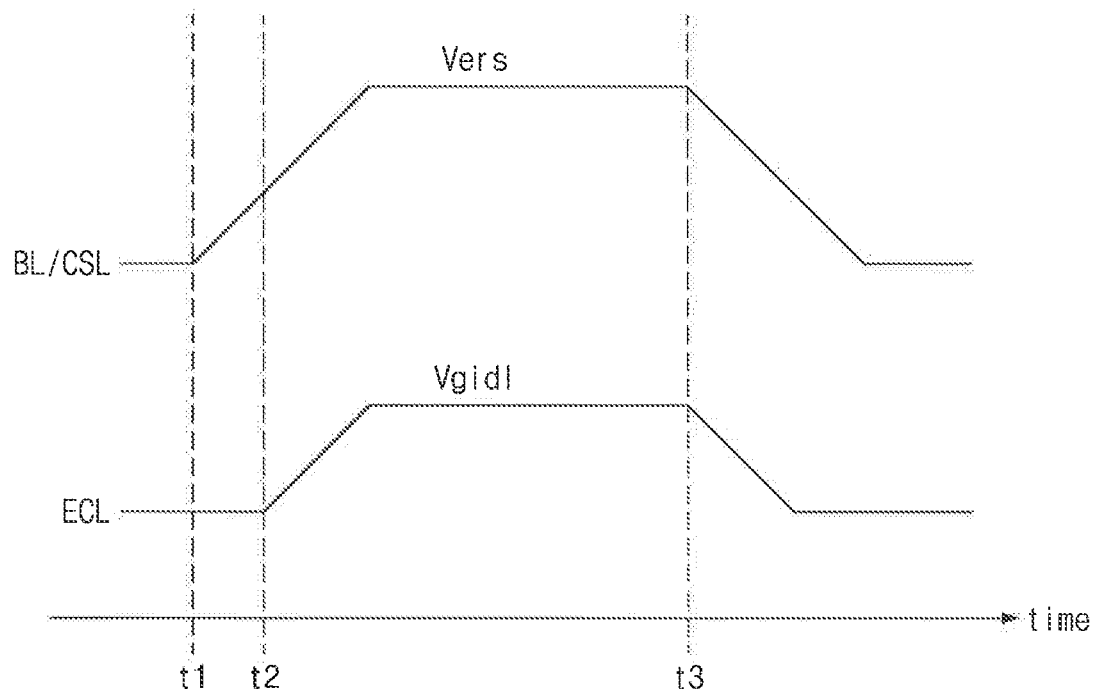
FIG. 10 is a timing diagram illustrating voltages applied for an erase operation according to an exemplary embodiment of the inventive concept.

FIG. 10 is a timing diagram illustrating voltages applied for an erase operation according to an exemplary embodiment of the inventive concept. For convenience of description, only, the erase voltage Vers and the GIDL voltage Vgid1 are illustrated in FIG. 10, but the inventive concept is not limited thereto.

Referring to FIG. 10, at a first time t1, the erase voltage Vers may be applied to at least one of the bit line BL and the common source line CSL. After the erase voltage Vers is applied, at a second time t2, the GIDL voltage Vgid1 may be applied to the erase control line ECL. In other words, the GIDL voltage Vgid1 may be applied after the erase voltage Vers is applied and a specified time elapses. At a third time t3, the applied voltages Vers and Vgid1 may be recovered. As described with reference to FIGS. 9A to 9C, the memory cells MC1 to MC4 of a cell string may be erased when the erase voltage Vers and the GIDL voltage Vgid1 are applied.

Figure 11:
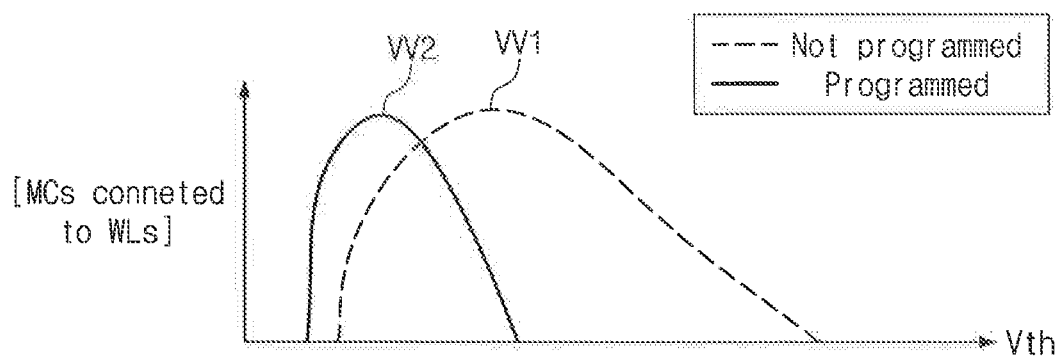
FIG. 11 is a diagram illustrating a threshold voltage distribution of memory cells changed through an erase operation according to an exemplary embodiment of the inventive concept.

FIG. 11 is a diagram illustrating a threshold voltage distribution of memory cells changed through an erase operation according to an exemplary embodiment of the inventive concept. Referring to FIG. 11, when an erase control transistor is not programmed, memory cells connected to word lines may have a first threshold voltage distribution VV1. According to an exemplary embodiment of the inventive concept, when the erase control transistor is programmed, the memory cells connected to the word lines may have a second threshold voltage distribution VV2.

As illustrated in FIG. 11, because the first threshold voltage distribution VV1 is wide compared with the second threshold voltage distribution VV2, the first threshold voltage distribution VV1 may include a threshold voltage (e.g., Vth) of a relatively higher level. In other words, when the erase control transistor is not programmed, there may be memory cells that are not properly erased. In contrast, because the second threshold voltage distribution VV2 is narrow compared with the first threshold voltage distribution VV1, the first threshold voltage distribution VV1 may include a threshold voltage (e.g., Vth) of a relatively lower level. In other words, when the erase control transistor is programmed, the reliability of the erase operation may be increased.

As described above, the nonvolatile memory device 100 according to an exemplary embodiment of the inventive concept may perform the erase operation by using the GIDL current. The nonvolatile memory device 100 may program an erase control transistor before performing the erase operation, thus increasing the GIDL current. Accordingly, the reliability of the erase operation may be increased.

Figure 12:
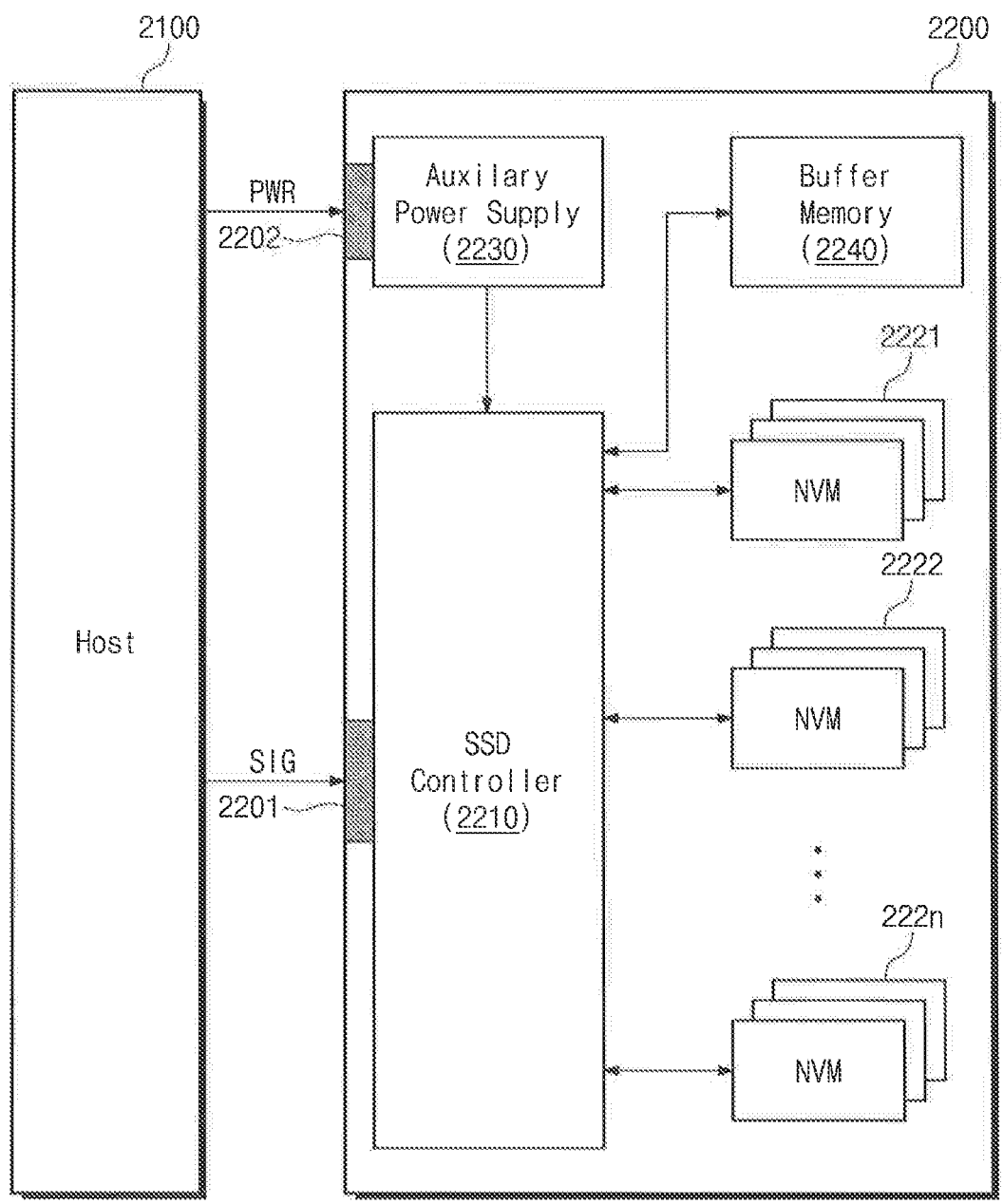
FIG. 12 is a block diagram illustrating a storage system including a nonvolatile memory device according to an exemplary embodiment of the inventive concepts.

FIG. 12 is a block diagram illustrating a storage system including a nonvolatile memory device according to an exemplary embodiment of the inventive concept. Referring to FIG. 12, a storage system 2000 may include a host 2100 and a storage device 2200.

The storage device 2200 exchanges a signal SIG with the host 2100 through a signal connector 2201 and is supplied with a power PWR through a power connector 2202. The storage device 2200 includes a solid state drive (SSD) controller 2210, a plurality of nonvolatile memories 2221 to 222n, an auxiliary power supply 2230, and a buffer memory 2240. In an exemplary embodiment of the inventive concept, each of the nonvolatile memories 2221 to 222n may include any one of nonvolatile memory devices described with reference to FIGS. 1 to 10.

The SSD controller 2210 may control the nonvolatile memories 2221 to 222n in response to the signal SIG received from the host 2100. The nonvolatile memories 2221 to 222n may operate under control of the SSD controller 2210. In an exemplary embodiment of the inventive concept, the SSD controller 2210 may be a memory controller described with reference to FIG. 1. The auxiliary power supply 2230 is connected to the host 2100 through the power connector 2202. The auxiliary power supply 2230 may be charged by the power PWR supplied from the host 2100. When the power is not smoothly supplied from the host 2100, the auxiliary power supply 2230 may power the storage device 2200.

A nonvolatile memory device according to an exemplary embodiment of the inventive concept may perform an erase operation by using a GIDL current. In this case, the GIDL current generated for the erase operation may be increased, thereby improving GIDL efficiency. Accordingly, a threshold voltage distribution of memory cells formed through the erase operation may be improved, and the reliability of the erase operation may be increased.

In addition, the nonvolatile memory device according to an exemplary embodiment of the inventive concept may decrease a TDDB of an erase control transistor for generating the GIDL current.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An operating method of a nonvolatile memory device which includes a cell string including a plurality of cell transistors connected in series between a bit line and a common source line and stacked in a direction perpendicular to a substrate, the method comprising:
  programming an erase control transistor of the plurality of cell transistors; and
  after the erase control transistor is programmed, applying an erase voltage to the common source line or the bit line and applying an erase control voltage to an erase control line connected to the erase control transistor,
  wherein the erase control voltage is less than the erase voltage and greater than a ground voltage, and
  wherein the erase control transistor is between a ground selection transistor of the plurality of cell transistors and the common source line or between a string selection transistor of the plurality of cell transistors and the bit line.

2. The method of claim 1, wherein the programming of the erase control transistor includes:
applying the ground voltage to the bit line and the common source line and applying a program voltage to the erase control line.

3. The method of claim 1, wherein the erase control transistor is programmed to increase a threshold voltage of the erase control transistor.

4. The method of claim 3, wherein the increased threshold voltage of the erase control transistor causes a gate induced drain leakage (GIDL) current from the erase control transistor to increase.

5. The method of claim 1, further comprising:
when the erase control transistor is between the ground selection transistor and the common source line, applying the erase voltage to the common source line and floating the bit line, after the erase control transistor is programmed.

6. The method of claim 1, further comprising:
when the erase control transistor is between the string selection transistor and the bit line, applying the erase voltage to the bit line and floating the common source line, after the erase control transistor is programmed.

7. The method of claim 1, further comprising:
floating a ground selection line connected to the ground selection transistor and a string selection line connected to the string selection transistor, after the erase control transistor is programmed.

8. A nonvolatile memory device, comprising:
a memory cell array including a cell string including a plurality of cell transistors connected in series between a bit line and a common source line and stacked in a direction perpendicular to a substrate;
a row decoder configured to control the common source line and an erase control line connected to an erase control transistor of the plurality of cell transistors;
an input/output circuit configured to control the bit line; and
a control logic circuit,
wherein, in an erase operation associated with the cell string, the control logic circuit controls the row decoder and the input/output circuit such that the erase control transistor is programmed and then controls the row decoder and the input/output circuit such that an erase voltage is applied to the common source line or the bit line and an erase control voltage is applied to the erase control line,
wherein the erase control voltage is less than the erase voltage and greater than a ground voltage, and
wherein the erase control transistor is between a ground selection transistor of the plurality of cell transistors and the common source line or between a string selection transistor of the plurality of cell transistors and the bit line.

9. The nonvolatile memory device of claim 8, wherein, in a program operation associated with the erase control transistor, the row decoder applies the ground voltage to the common source line and applies a program voltage to the erase control line, and the input/output circuit applies the ground voltage to the bit line.

10. The nonvolatile memory device of claim 8, wherein the erase control transistor is programmed such that a threshold voltage of the erase control transistor increases to at least a reference voltage.

11. The nonvolatile memory device of claim 10, wherein the reference voltage is a voltage which allows a gate induced drain leakage (GIDL) current from the erase control transistor to increase.

12. The nonvolatile memory device of claim 8, wherein, after the erase control transistor is programmed in the erase operation, the control logic circuit controls the row decoder such that a ground selection line connected to the ground selection transistor and a string selection line connected to the string selection transistor are floated.

13. A storage system, comprising:
a nonvolatile memory device including a cell string including a plurality of cell transistors connected in series between a bit line and a common source line and stacked in a direction perpendicular to a substrate; and
a memory controller configured to provide a first command and a second command to the nonvolatile memory device,
wherein, after programming an erase control transistor of the plurality of cell transistors in response to the first command, the nonvolatile memory device is configured to apply an erase voltage to the common source line or the bit line and an erase control voltage to an erase control line connected to the erase control transistor in response to the second command,
wherein the erase control voltage is less than the erase voltage and greater than a ground voltage, and
wherein the erase control transistor is between a ground selection transistor of the plurality of cell transistors and the common source line or between a string selection transistor of the plurality of cell transistors and the bit line.

14. The storage system of claim 13, wherein, in response to the first command, the nonvolatile memory device applies the ground voltage to the common source line and the bit line and applies a program voltage to the erase control line.

15. The storage system of claim 13, wherein the erase control transistor is programmed such that a threshold voltage of the erase control transistor increases to a reference voltage or greater.

16. The storage system of claim 15, wherein the reference voltage is a voltage which allows a gate induced drain leakage (GIDL) current from the erase control transistor to become a reference current or greater.

17. The storage system of claim 13, wherein, when the erase control transistor is between the ground selection transistor and the common source line, in response to the second command, the nonvolatile memory device applies the erase voltage to the common source line and floats the bit line.

18. The storage system of claim 13, wherein, when the erase control transistor is between the string selection transistor and the bit line, in response to the second command, the nonvolatile memory device applies the erase voltage to the bit line and floats the common source line.

19. The storage system of claim 13, wherein the nonvolatile memory device floats a ground selection line connected to the ground selection transistor and a string selection line connected to the string selection transistor in response to the second command.

20. The storage system of claim 13, wherein another erase control transistor of a memory block including the cell string is connected to the erase control line.

* * * * *